(12) United States Patent
Milke et al.

(10) Patent No.: US 12,550,258 B2
(45) Date of Patent: Feb. 10, 2026

(54) ELECTRICAL SOLDER CONNECTION, SENSOR WITH A SOLDER CONNECTION AND METHOD OF MANUFACTURE

(71) Applicant: TDK Electronics AG, Munich (DE)

(72) Inventors: Bettina Milke, Berlin (DE); Erkan Eser, Berlin (DE)

(73) Assignee: TDK Electronics AG, Munich (DE)

( * ) Notice: Subject to any disclaimer, the term of this patent is extended or adjusted under 35 U.S.C. 154(b) by 1053 days.

(21) Appl. No.: 17/630,350

(22) PCT Filed: Feb. 26, 2021

(86) PCT No.: PCT/EP2021/054901
§ 371 (c)(1),
(2) Date: Jan. 26, 2022

(87) PCT Pub. No.: WO2021/197722
PCT Pub. Date: Oct. 7, 2021

(65) Prior Publication Data
US 2022/0295633 A1   Sep. 15, 2022

(30) Foreign Application Priority Data
Apr. 2, 2020   (DE) .......................... 102020109226.1

(51) Int. Cl.
*H05K 1/11*   (2006.01)
*B23K 1/00*   (2006.01)
(Continued)

(52) U.S. Cl.
CPC ............ *H05K 1/118* (2013.01); *B23K 1/0008* (2013.01); *B23K 1/0056* (2013.01);
(Continued)

(58) Field of Classification Search
CPC ........... H05K 2203/107; H05K 3/3494; H05K 3/363; H05K 1/118; H05K 1/189;
(Continued)

(56) References Cited

U.S. PATENT DOCUMENTS 3,926,360 A   12/1975   Moister, Jr.
5,977,512 A   11/1999   Azdasht
(Continued)

FOREIGN PATENT DOCUMENTS

CN   1822107 A   8/2006
CN   106271062 A   1/2017
(Continued)

OTHER PUBLICATIONS

Examination Report in Japanese Patent Application No. 2022-509070, dated Feb. 13, 2024, in Japanese (4 pages).
(Continued)

*Primary Examiner* — Vy T Nguyen
(74) *Attorney, Agent, or Firm* — Nixon Peabody LLP

(57) ABSTRACT

A solder connection that connects a contact pad on a first surface to a strip-shaped conductor. The strip-shaped conductor has a widening at one end and a through opening therein. A solder ball is located in the opening and connects the end of the conductor to the contact pad.

11 Claims, 2 Drawing Sheets

(51) Int. Cl.
B23K 1/005 (2006.01)
B23K 101/42 (2006.01)

(52) U.S. Cl.
CPC .................. *B23K 2101/42* (2018.08); *H05K 2201/10151* (2013.01); *H05K 2203/107* (2013.01)

(58) Field of Classification Search
CPC ............... H05K 3/328; H05K 3/3447; H05K 2203/0195; H05K 1/147; H05K 2201/09481; H05K 2203/0228; H05K 1/144; H05K 2201/0108; H05K 2203/043; H05K 2201/058; H05K 2201/10106; H05K 1/0269; H05K 2201/0311; H05K 2201/09918; H05K 2203/16; H05K 1/111; H05K 2201/0394; H05K 2203/1545; H05K 3/3485; H05K 3/4092; H05K 1/0306; H05K 1/141; H05K 1/181; H05K 2201/0939; H05K 2201/10151; H05K 3/341; H05K 3/4007; H05K 1/0265; H05K 1/116; H05K 2201/0133; H05K 2201/0145; H05K 2201/0154; H05K 2201/041; H05K 2201/10037; H05K 2201/10189; H05K 2201/10272; H05K 2203/0545; H05K 2203/082; H05K 2203/1509; H05K 2203/1581; H05K 3/281; H05K 3/368; H05K 2201/09609; H05K 2201/10303; H05K 2201/10666; H05K 3/361; H05K 1/0218; H05K 1/0277; H05K 1/0393; H05K 1/092; H05K 1/115; H05K 1/14; H05K 2201/0397; H05K 2201/0969; H05K 2201/1081; H05K 2201/10977; H05K 2203/0475; H05K 2203/1147; H05K 2203/1311; H05K 2203/304; H05K 3/34; H05K 3/3463; H05K 3/4046; H05K 1/0266; H05K 1/0274; H05K 1/028; H05K 1/0283; H05K 1/0386; H05K 1/113; H05K 1/184; H05K 13/0465; H05K 2201/0314; H05K 2201/09409; H05K 2201/09418; H05K 2201/09572; H05K 2201/0999; H05K 2201/10121; H05K 2201/10166; H05K 2201/10477; H05K 2201/1059; H05K 2201/10681; H05K 2201/10704; H05K 2201/10901; H05K 2201/2054; H05K 2203/0165; H05K 2203/0405; H05K 2203/041; H05K 2203/0425; H05K 2203/0455; H05K 3/0058; H05K 3/0097; H05K 3/062; H05K 3/12; H05K 3/246; H05K 3/247; H05K 3/303; H05K 3/306; H05K 3/326; H05K 3/3421; H05K 3/3436; H05K 3/3457; H05K 3/3468; H05K 3/366; H05K 3/403; H05K 7/209; B23K 2101/42; B23K 1/0056; B23K 1/0016; B23K 2103/12; B23K 1/19; B23K 26/32; B23K 1/20; B23K 37/04; B23K 37/0435; B23K 2103/10; B23K 1/008; B23K 26/22; B23K 1/005; B23K 11/16; B23K 20/10; B23K 20/233; B23K 2101/36; B23K 2103/18; B23K 26/0846; B23K 26/21; B23K 1/0053; B23K 26/0838; B23K 26/10; B23K 3/08; B23K 3/087; B23K 1/203; B23K 2103/08; B23K 26/032; B23K 26/14; B23K 26/1476; B23K 26/16; B23K 26/60; B23K 3/04; B23K 2101/38; B23K 2101/40; B23K 26/03; B23K 3/063; B23K 3/0638; B23K 3/082; B23K 35/268
USPC .............. 219/121.64, 121.85, 85.13, 121.63, 219/121.66, 121.78, 121.8, 85.15; 228/104, 179.1, 180.21, 248.1, 103, 188, 228/190, 212, 234.1, 254, 44.7; 439/78; 385/88

See application file for complete search history.

(56) References Cited

U.S. PATENT DOCUMENTS

| | | | |
|---|---|---|---|
| 6,457,633 B1 | 10/2002 | Takashima et al. | |
| 7,658,001 B1* | 2/2010 | Houk | B23K 1/0016 |
| | | | 228/256 |
| 9,398,697 B2 | 7/2016 | Martensson | |
| 2001/0001587 A1* | 5/2001 | Lee | G11B 5/4853 |
| | | | 360/245.9 |
| 2004/0031339 A1 | 2/2004 | Swanson | |
| 2018/0110131 A1 | 4/2018 | Hanisch et al. | |
| 2019/0226918 A1 | 7/2019 | Hand | |

FOREIGN PATENT DOCUMENTS

| | | |
|---|---|---|
| CN | 107950082 A | 4/2018 |
| CN | 109863378 A | 6/2019 |
| DE | 19544929 A1 | 6/1997 |
| DE | 19739481 A1 | 10/1998 |
| DE | 10138583 A1 | 2/2003 |
| DE | 102004027774 A1 | 8/2005 |
| EP | 1283664 A2 | 2/2003 |
| JP | S55-7285 U1 | 1/1980 |
| JP | H0428116 A | 1/1992 |
| JP | H08-31402 A | 2/1996 |
| JP | 2006-305634 A | 11/2006 |
| JP | 2015-177082 A | 10/2015 |
| WO | 2019120913 A1 | 6/2019 |

OTHER PUBLICATIONS

Examination Report in Japanese Patent Application No. 2022-509070, dated Aug. 8, 2023, in Japanese (3 pages).
Examination Report in Japanese Patent Application No. 2022-509070, dated Mar. 14, 2023, in Japanese (3 pages).
International Search Report and Written Opinion of International Searching Authority corresponding to International Patent Application No. PCT/EP2021/054901, with English translation of International Search Report, mailed Jun. 7, 2021 (12 pages).
Burkhardt, T. et al.; "Low-strain laser-based solder joining of mounted lenses"; Proceedings of SPIE, IEEE, US, vol. 9574, pp. 95740M-95740M; Sep. 2, 2015; DOI: 10.1117/12.2186747; ISBN: 978-1-62841-730-2; XP060059848 (14 pages).
Oppert, T. et al.; "Micro ball bumping packaging for wafer level & 3-d solder sphere transfer and solder jetting"; Electronic Manufacturing Technology Symposium (IEMT), 2012 35th IEEE/CPMT International, pp. 1-6; Nov. 6, 2012; DOI: 10.1109/IEMT.2012.6521835; ISBN: 978-1-4673-4384-8; XP032415532 (6 pages).
Oppert, T. et al.; "A Roadmap to Low Cost Flip Chip and CSP using Electroless Ni/Au"; 2nd 1998 IEMT/IMC Symposium (IEEE Cat. No. 98EX225), Tokyo, Japan; 1998; pp. 106-113; DOI: 10.1109/IEMTIM.1998.704534 (8 pages).
Burkhardt, T. et al.; "Laser-based soldering technique for hermetical sealing of the calibration target for the Exomars' Raman instrument"; 2016 4th International Conference on Photonics, Optics and Laser Technology (Photoptics), Rome, pp. 1-7 (7 pages).

* cited by examiner

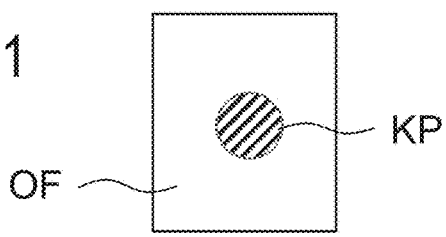
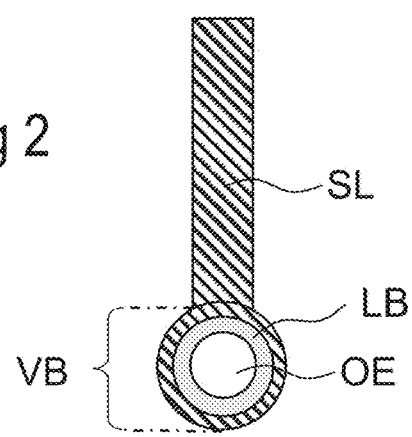
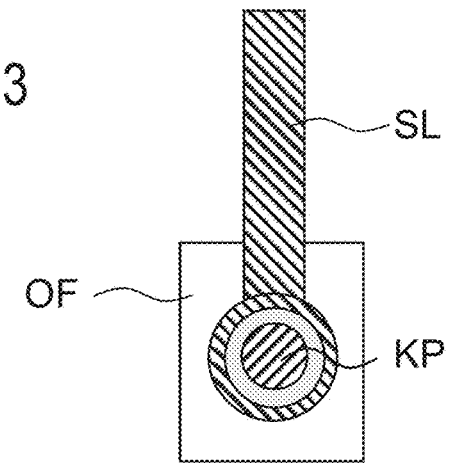
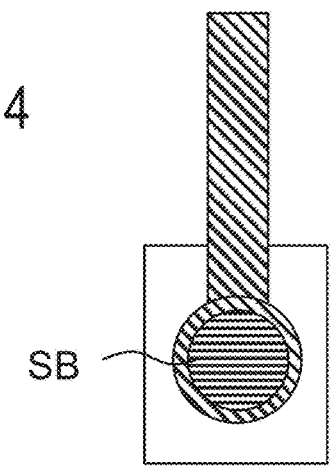
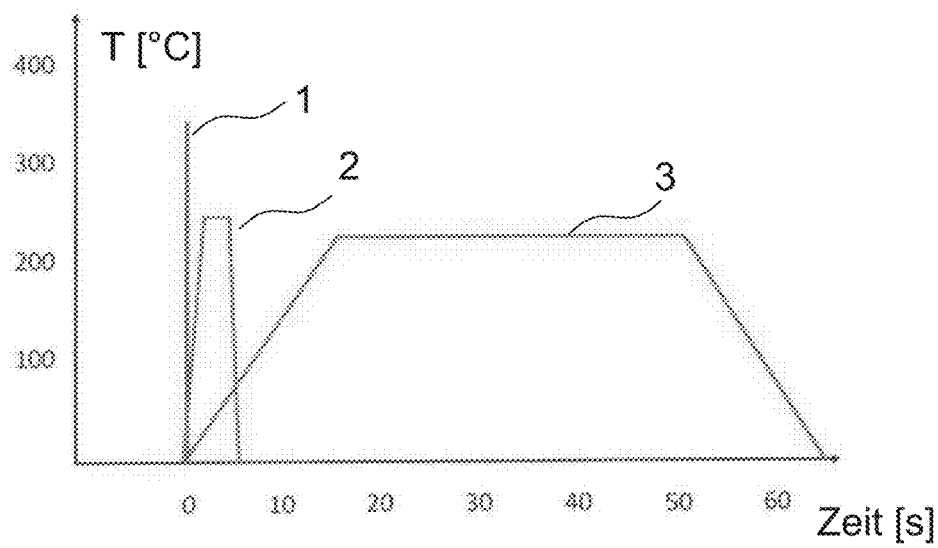

ELECTRICAL SOLDER CONNECTION, SENSOR WITH A SOLDER CONNECTION AND METHOD OF MANUFACTURE

CROSS-REFERENCE TO RELATED APPLICATIONS

This application is a U.S. National Stage of International Application No. PCT/EP2021/054901, filed Feb. 26, 2021, which claims the benefit of German Patent Application No. 102020109226.1, filed Apr. 2, 2020, both of which are incorporated herein by reference in their entireties.

The application relates to a solder connection, a sensor with the solder connection and a method for manufacturing the solder connection. In particular, it relates to a solder connection with a temperature-sensitive contact point.

There are electrical components which are sensitive to pressure and/or temperature. For the electrical contacting of such components, care must be taken on the one hand to ensure that the electrical connection is made without a too great mechanical load and also with only a low temperature input.

Sensor components have sensitive structures, for example functional layers that are sensitive to pressure or temperature. For contacting sensor components, wire bonding methods are used, for example. However, space is often limited in a sensor component. In this case, these processes have only limited applicability, since wire bonding requires additional installation space in the area of the contact surface to be contacted.

In addition, wire bonding methods lead to mechanically insufficiently stable connections that can easily break off and, in particular, are also sensitive to vibrations or other mechanical stress during operation of such a sensor component.

Other contacting methods, such as flip-chip bonding by reflow soldering, can influence or change the sensor properties and are therefore usually not suitable either.

A task of the present invention is to specify a solder connection that can be produced with less space requirement and whose generation produces only a low temperature input into the contact pad to be contacted. A further task is to specify a sensor component whose electrical connection can be made with a small space requirement and which leads to a sufficiently stable electrical connection mechanically.

At least part of these tasks is solved by a component according to claim 1 and a method of manufacture according to the further independent claim.

A solder connection is disclosed which is formed between a contact pad on a first surface and a strip-shaped conductor. The conductor has a widening at one end and a through opening therein. A solder ball is disposed in the opening to electrically connect the end of the conductor to the contact pad.

The strip-shaped conductor is flat and therefore requires only a small overall height, so that the solder connection together with the supply line can be compactly designed. The solder ball is arranged in the opening so that it fills the opening. Due to the opening, the area with which the solder contacts the contact pad is predetermined in terms of size and exact position relative to the strip-shaped conductor.

The exact size of the solder ball can also be used to set the amount of heat transferred by the application of the solder. The contact pad can be a part of a temperature-sensitive component and, for example, represent its electrical connection pad. Then, with an appropriately sized solder ball, the amount of heat that can be transferred to the component and which may thermally stress the component when the solder connection is made can be minimized or set to a sufficiently low value.

The strip-shaped conductor can be formed as a conductor path on a likewise strip-shaped substrate. In this case, the through opening then extends through the widening of the conductor path and through the substrate. This design has the advantage that the mechanical properties of the conductor can be adjusted by a suitable selection of the substrate material. For example, it is possible to make the conductor itself flexible by means of a flexible substrate. In this way, it is possible to adapt the conductor in its course to the given space conditions.

The conductor can connect the contact pad to any other contact, which can be arranged in a wide variety of orientations relative to the contact pad due to the flexible design. In particular, the conductor is suitable for electrically connecting the contact pad to a contact arranged in spatial proximity. This spatially proximate contact can be provided on a printed circuit board. The conductor then connects the contact pad, and thus an electrical component, to a printed circuit board.

The substrate can be electrically insulating, so that the conductor is protected against a short circuit on one side when in contact with another conductive element.

Further, the conductor path itself can additionally be provided with a protective layer, which passivates or electrically insulates the surfaces of the conductor path that do not lie on the substrate. At least the interior of the opening is free of the protective layer to allow sufficient electrical contact between the conductor path and the solder ball.

In one embodiment, the conductor has a conductor path comprising Cu, which is provided with a solderable coating in the region of the opening. The solderable coating in the region of the opening may comprise gold (Au) or any other metal having a solderable surface. By solderable surface is meant a wettability with liquid solder, which is a precondition for producing a mechanically stable solder connection.

According to a further embodiment, the strip-shaped conductor is formed as a conductor path on a likewise strip-shaped carrier made of polyimide.

A sufficiently mechanically stable solder connection for electrical contacting purposes can be achieved with a conductor in which the diameter of the opening is between 50 µm and 1 mm.

The conductor can be designed flexible and can take any course between the contact and the contact pad and may be adapted to the spatial conditions. For example, the conductor can run parallel to the first surface with the contact pad. The conductor may also have a shape that forms an acute or right angle with the first surface.

The contact pad may have a thickness of 50 nm to 500 nm. This is sufficient for contacting electrical components or passive components such as sensors that have relatively low current requirements According to one embodiment, an electrical component is formed as a sensor that is contacted with a circuit environment via the conductor using a solder connection as described above.

The sensor may then comprise a sensor housing in which the following components are arranged:
- a circuit board with a µ-processor
- a sensor substrate with a functional layer having a sensor function
- a contact pad connected to the functional layer or to a conductive structure on or in the functional layer a strip-shaped conductor connecting the contact pad to the circuit board.

In this way, the conductor connects the contact pad and thus the functional layer of the sensor to the µ-processor on the PCB by means of the solder connection. The contact and contact pad may include Ni and or Au.

The contact pad may be on a stretch body, which may be the functional layer and may be solid (e.g. made of steel, glass, or ceramic) or flexible (e.g. made of a plastic film such as PI, thin glass, or ceramic paper). The stretch body expands with increasing temperature and can thus act on the functional layer of the sensor element with a temperature-dependent strength.

The sensor element, which comprises the functional layer, and the circuit board, which comprises the control and/or evaluation electronics required for the sensor function, can be arranged together in the common sensor housing in a minimal space.

The sensor can be designed as a temperature sensor and comprise a thermistor material as the functional layer. Then, the circuit board for determining the temperature-dependent electrical resistance is formed in the functional layer of thermistor material.

Other types of sensors that can be equipped with the proposed solder connection are sensors for measuring an electrical resistance or pressure sensors. The sensor may also be adapted for use as a microphone.

A method of fabricating the solder connection may include the following steps:
- a sensor substrate having a contact pad is provided,
- a strip-shaped conductor having a widening at one end with a through opening therein is placed on the contact pad such that the opening is positioned over the contact pad,
- a liquid solder ball is printed into the opening from above by means of laser solder jet bonding,
- the solder balls are allowed to cool, creating an electrically conductive connection between the conductor and the contact pad.

Laser solder jet bonding or solder ball bumping is a process originally derived from the inkjet printing process. A solid solder ball of defined size is loaded into an outwardly open cannula located in a print head of a solder-jet device. The solder ball is then liquefied by rapid heat input and jetted out of the cannula, for example by means of a gas stream. The process is particularly suitable for "printing" liquid solder balls of precisely defined size at specific locations. In this way, small solder spots can be created. It is also possible to create solder structures with a desired geometry and dimension by printing several solder balls at defined locations.

As in an inkjet printing process, the print head of the solder jet device can move to a desired location on a surface to be printed in a very short time and print or deposit one or more solder balls there. In this way, the present process also succeeds in depositing a solder ball at a precise location in the through-opening of the conductor in such a way that a solder connection is made between the conductor and the contact pad. The solder ball can thereby adapt to the geometry of the through opening.

In the following, the invention will be explained in more detail with reference to examples of embodiments and the accompanying figures.

The figures are schematic and not to scale, so that neither absolute nor relative size indications can be taken from them. Identical or similarly acting parts are marked with the same reference sign in different figures.

FIG. 1 shows a surface with a contact pad

FIG. 2 shows a strip-shaped conductor in plan view

FIG. 3 shows a strip-shaped conductor according to FIG. 2 after placement on the surface according to FIG. 1

FIG. 4 shows from FIG. 3 after inserting a solder ball into the opening

FIG. 5 shows the temperature/time behavior at a solder connection when using different soldering techniques

Figure 6A:
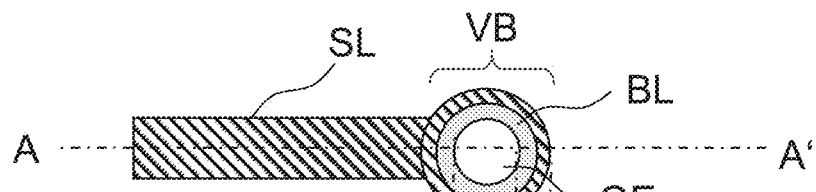
FIG. 6A shows a top view of a conductor path

FIG. 1 shows a surface OF with a contact pad KP applied to it. The surface is, for example, the surface of a functional layer of a sensor element and may comprise, for example, a thermistor material such as an NTC or a PTC material. The contact pad is made of metal such as Al or Ni and has a solderable coating. Alternatively, the contact pad may be made entirely of solderable metal. For a sensor application, when the surface OF is a functional sensor layer, a thickness of the contact pad of 50 nm to 500 nm is sufficient.

FIG. 2 shows a flat strip-shaped conductor SL in plan view. One end of the strip-shaped conductor has a widening VB in which a through-opening OE is arranged. At least the inner edges of the opening are provided with a solderable coating LB. The solderable coating can overlap the conductor at the edge of the opening. In the widening VB, the conductor SL may have a round outline as shown when viewed from above. Accordingly, the opening may also have a round opening cross-section. The side walls of the opening may be vertical.

However, the outline of the widening may also have a different and, for example, rectangular shape.

The conductor may comprise Cu. The solderable coating may comprise Au. The conductor may be made entirely of metal. However, it may also be formed as a conductor path on a substrate STS, which is also strip-shaped. Preferably, the conductor SL, conductor path LB and substrate STS are flexible.

FIG. 3 shows a strip-shaped conductor SL according to FIG. 2 from above, which has been placed on the surface OF according to FIG. 1 in such a way that the contact pad KP is arranged below the opening OE. Preferably, the opening is centered on the contact pad so that the contact pad completely fills the cross-sectional area of the opening as seen from above.

FIG. 4 shows the arrangement of FIG. 3 after a solder ball SB has been placed in the opening OE and soldered the conductor to the contact pad via the solderable coating LB.

The solder ball largely fills the opening but may still protrude beyond its upper edge.

Depending on the size of the cross-sectional area of the opening OE or depending on the diameter of a round opening, the breakaway force of the solder connection can be adjusted. Corresponding solder balls can then have diameters from 50 µm to 1 mm. With, for example, solder balls with a diameter of 350 µm strong solder connections can be obtained which resist shear forces of up to approx. 300 cN per solder ball. The pull-off forces that can be achieved are correspondingly high, also at approx. 300 cN per solder ball.

Depending on the solder alloy selected, the melting point of the solder and thus the temperature resistance of the solder connection can be adjusted. With the solder alloy Au80Sn20, the solder connection can be set stable up to 280° C. Other alloys allow low melting points down to a minimum of 100° C.

A preferred process for making the solder connection is laser solder jet bonding. In this process, only a short and selective thermal load is applied to the surface, rather than a complete load on the component/surface over a longer period.

FIG. 5 shows a comparison of the temperature/time behavior of a solder connection when using different soldering techniques. The highest temperature load is experienced by the surface and thus the entire component during reflow soldering in a reflow oven. Curve 3 illustrates the temperature behavior over time, e.g. 60 seconds, which is required for reliable soldering.

Curve 2 represents a solder iron soldering process in which the solder is melted with a heating head via pressure contact. Here, the thermal stress is shorter compared to reflow soldering, but it cannot be controlled as well.

Curve 1 shows only a single narrow temperature peak, as is usually measured in laser solder jet bonding. This shows that the thermal stress occurs only selectively and very briefly (<1 s), and that the amount of heat introduced corresponds only to that of the imprinted liquid solder ball, which is small and dissipates very quickly by means of dissipation.

Laser solder jet bonding has the further advantage that it can be carried out without contact. Thus, there is no mechanical stress on the surface or even on the solder connection during the soldering process.

FIG. 6A shows a top view of a strip-shaped conductor as already shown in FIG. 2.

Figure 6B:
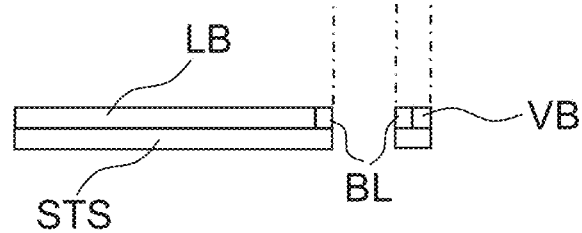
FIG. 6B shows the conductor path of FIG. 6A in a cross-sectional view

FIG. 6B shows the strip-shaped conductor SL of FIG. 6A in a cross-section along the line AA' shown in FIG. 6A. The cross-section shows a substrate STS, also strip-shaped, on which a thin conductor LB is deposited. The substrate is, for example, a polyimide film which can also withstand mechanical stress due to bending or vibration without damage. The opening OE in the conductor path LB also passes through the STS with the same cross-section. It can be seen here that the solderable coating BL completely covers the side walls of the conductor path in the opening.

Figure 7:
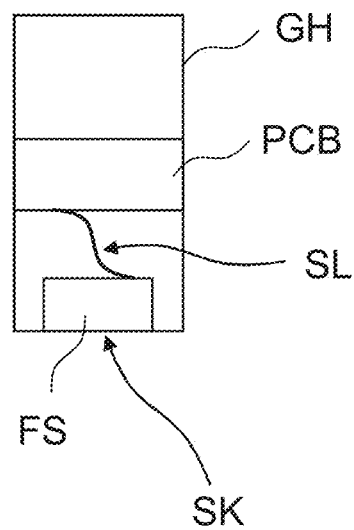
FIG. 7 shows a sensor in whose sensor housing a flexible strip-shaped conductor is electrically connected to a contact via a solder connection.

FIG. 7 shows a sensor in whose sensor housing a flexible strip-shaped conductor SL electrically connects a contact pad on a functional layer FS of a sensor element to a contact on a PCB via a solder connection. The functional layer is the functional core of the sensor element and is located within a sensor housing GH. In spatial proximity to the sensor element, the PCB is arranged in the housing. It can be arranged arbitrarily with respect to the surface of the functional layer, for example as shown or vertically with respect thereto. The flexible strip-shaped conductor SL also allows bent or angled conductor runs without damage.

The functional layer is arranged at one end of the housing, at the so-called sensor head SK. The sensor head can be designed for a pressure contact, which can, for example, determine the temperature of a surface by pressing on the sensor head.

However, the sensor head can also be immersed in a medium or determine the temperature of the atmosphere for measurement.

Although only described in more detail for a temperature sensor, the solder connection presented is also suitable for any other sensors. It is characterized by small space requirements and simple manufacturing. The manufacturing process can be carried out without mechanical and thermal stress on the solder connection and is therefore particularly suitable for mechanically and thermally sensitive components or sensors.

LIST OF REFERENCE SIGNS 1, 2, 3 temperature/time measurement curves
AA' sectional plane
BL solderable coating
FS functional layer
GH sensor housing
KP contact pad
LB conductor path
OE through opening
OF first surface
PCB printed circuit board
SB solder ball
SK sensor head
SL strip-shaped conductor
STS strip-shaped substrate/carrier
VB widening

The invention claimed is:

1. A solder connection for a flux-free process,
the solder connection being formed between a first surface on which a contact pad is arranged and a strip-shaped conductor,
wherein the strip-shaped conductor has at one end a widening and a through-opening,
wherein a solder ball is arranged in the through-opening and connects the end of the strip-shaped conductor to the contact pad,
wherein the strip-shaped conductor is planar,
wherein a side wall of the through-opening is vertical, and
wherein the strip-shaped conductor is electrically insulatingly covered except at the vertical side wall of the through-opening, by a substrate of the strip-shape conductor, a protective layer, or both.

2. The solder connection according to claim 1,
wherein the strip-shaped conductor is formed as a conductor path on the substrate that is likewise strip-shaped, and
wherein the through opening extends through the widening and the strip-shaped substrate.

3. The solder connection according to claim 2,
wherein the strip-shaped substrate comprises a flexible material which is a plastic film.

4. The solder connection according to claim 1,
wherein the strip-shaped conductor comprises a conductor path comprising copper (Cu), which is provided with a solderable coating in the region of the through-opening.

5. The solder connection according to claim 4,
wherein the solderable coating comprises gold (Au) in the region of the through-opening.

6. The solder connection according to claim 1,
wherein the strip-shaped conductor is formed as a conductor path on a likewise strip-shaped carrier of polyimide.

7. The solder connection according to claim 1,
wherein the diameter of the through-opening is between 50 μm and 1 mm.

8. The solder connection according to claim 1,
wherein the strip-shaped conductor is formed as a conductive path that runs parallel to the first surface or is bent upwards from the first surface.

9. The solder connection according to claim 1, wherein the contact pad has a thickness of 50 nm to 500 nm.

10. A sensor having the solder connection according to claim 1, the sensor comprising a sensor housing in which are arranged
- a printed circuit board with a microprocessor,
- a substrate with a functional layer having a sensor function,
- a contact pad connected to the functional layer or a conductive structure on or in the functional layer, and
- a strip-shaped conductor which connects the contact pad to the circuit board,
- wherein the conductor is connected to the contact pad by means of the solder connection.

11. A method of manufacturing a solder connection,
- providing a substrate having a contact pad on a surface,
- placing a strip-shaped conductor having a widening at one end with a through-opening therein on the surface with the contact pad in such a way that the through-opening is arranged above the contact pad,
  - wherein the strip-shaped conductor is planar,
  - wherein a side wall of the through-opening is vertical, and
  - wherein the strip-shaped conductor is electrically insulatingly covered except at the vertical side wall of the through-opening by a substrate of the strip-shaped conductor, a protective layer, or both,
- printing one or more liquid solder balls into the through-opening from above by laser solder jet bonding, and
- allowing the solder balls to cool, whereby an electrically conductive.

* * * * *